United States Patent [19]

Takemae et al.

[11] Patent Number: 4,641,166
[45] Date of Patent: Feb. 3, 1987

[54] SEMICONDUCTOR MEMORY DEVICE HAVING STACKED CAPACITOR-TYPE MEMORY CELLS

[75] Inventors: Yoshihiro Takemae, Tokyo; Tomio Nakano, Kawasaki; Kimiaki Sato, Tokyo, all of Japan

[73] Assignee: Fujitsu Limited, Kawasaki, Japan

[21] Appl. No.: 560,171

[22] Filed: Dec. 12, 1983

[30] Foreign Application Priority Data

Dec. 20, 1982 [JP] Japan .................. 57-222079

[51] Int. Cl.$^4$ ............................ H01L 29/78
[52] U.S. Cl. .................... 357/23.6; 357/51; 357/54
[58] Field of Search .......... 357/23.6, 23.11, 51, 357/24, 54

[56] References Cited

U.S. PATENT DOCUMENTS

| 3,740,731 | 6/1973 | Ohwada et al. | 357/23.6 |
| 3,811,076 | 5/1974 | Smith, Jr. | 357/41 |
| 3,893,146 | 7/1975 | Heeren | 357/23.6 X |
| 4,151,607 | 4/1979 | Koyanagi et al. | 357/23.6 |
| 4,246,593 | 1/1981 | Bartlett | 357/41 |
| 4,355,374 | 10/1982 | Sakai et al. | 357/23.6 X |

FOREIGN PATENT DOCUMENTS

| 0032279 | 11/1981 | European Pat. Off. |  |
| 2493045 | 10/1980 | France. |  |
| 0021170 | 2/1980 | Japan | 357/23 C |
| 55-154762 | 12/1980 | Japan. |  |

Primary Examiner—Martin H. Edlow
Assistant Examiner—Sara W. Crane
Attorney, Agent, or Firm—Staas & Halsey

[57] ABSTRACT

In a semiconductor memory device having stacked capacitor-type memory cells, the capacitor of each memory cell comprises an electrode, an insulating layer, and a counter electrode. The electrode is connected electrically to a source or drain region of a transfer transistor and extends over a part of a word line adjacent to another word line serving a gate electrode of the transfer transistor, at which part no memory cell is formed.

10 Claims, 8 Drawing Figures

SEMICONDUCTOR MEMORY DEVICE HAVING STACKED CAPACITOR-TYPE MEMORY CELLS

BACKGROUND OF THE INVENTION

The present invention relates to a metal-oxide semiconductor (MOS, or, more broadly, MIS) dynamic semiconductor memory device having stacked capacitor-type memory cells.

Recently, MOS memory cells of a one-transistor one-capacitor type have usually been used in MOS dynamic memory devices. Fine lithographic technology has been developed so as to reduce the size of the elements of each memory cell, thereby obtaining a large capacity of a highly integrated semiconductor device. However, there is a limit to obtaining a high integration and a large capacity by size reduction only. In addition, size reduction of memory cells increases the generation rate of soft errors and the number of harmful effects due to hot electrons and hot holes. For improving memory cells of a one-transistor one-capacitor type, stacked capacitor-type memory cells have been proposed (see: Technical Digest of the Institute of Electronics and Communication Engineers of Japan, SSD80-30, 1980, July). Each stacked capacitor-type memory cell comprises a transfer transistor, which is the same as that of the conventional memory cell, and a capacitor which comprises an electrode extending over a thick field-insulating layer and over its own transfer transistor, a counter electrode disposed on the electrode, and an insulating layer therebetween, thereby increasing the capacitance of the capacitor.

In the prior art, however, such stacked capacitor-type memory cells have been applied to devices having "open bit lines" which are arranged on both sides of a series of sense amplifiers, not to devices having "folded bit lines" which are arranged on one side of a series of sense amplifiers.

SUMMARY OF THE INVENTION

It is an object of the present invention to apply stacked capacitor-type memory cells to a semiconductor memory device having folded bit lines.

According to the present invention, the electrodes of a capacitor of a memory cell are formed on the part of an adjacent word line at which no memory cell is formed, thereby remarkably increasing the capacitance of the capacitor.

BRIEF DESCRIPTION OF THE DRAWINGS

The present invention will be more clearly understood from the description as set forth below with reference to the accompanying drawings.

DESCRIPTION OF THE PREFERRED EMBODIMENTS

Figure 1:
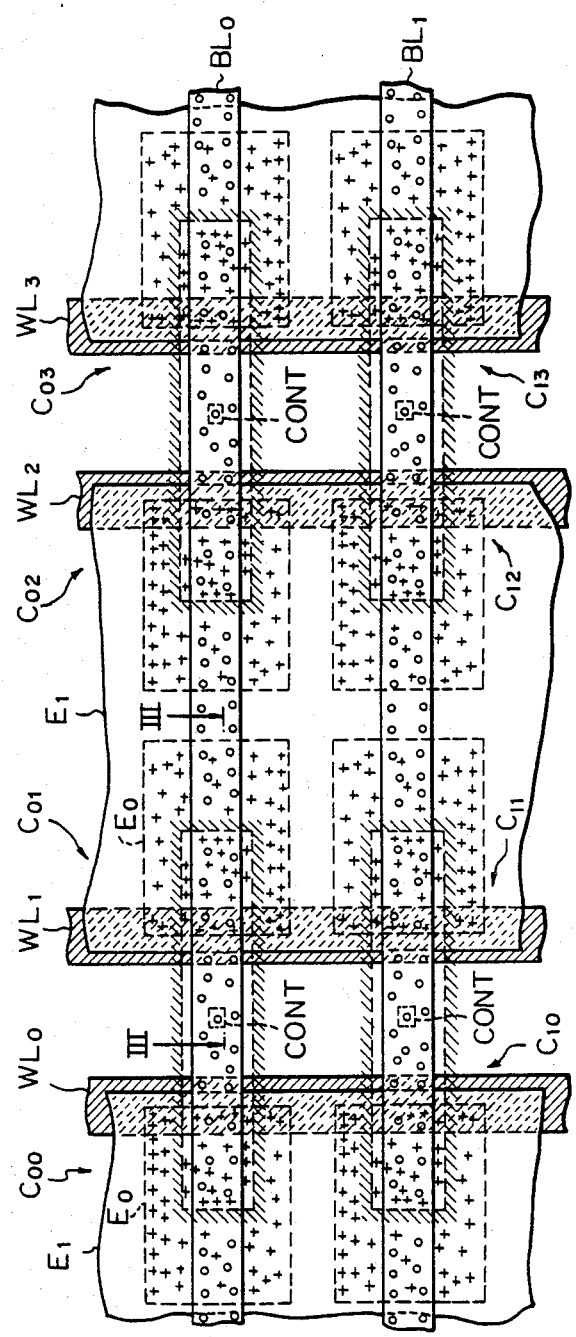
FIG. 1 is a plan view of a prior art semiconductor memory device incorporating stacked capacitor-type memory cells.
Figure 2:
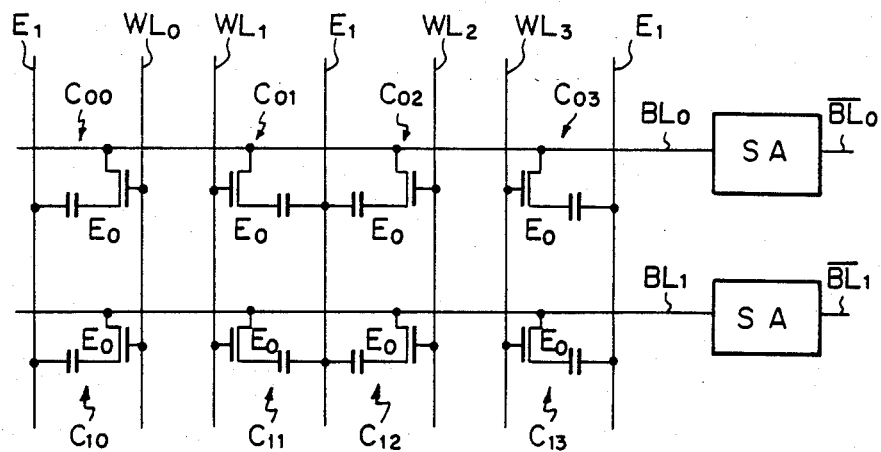
FIG. 2 is an equivalent circuit diagram of the device of FIG. 1.

In FIG. 1, which illustrates the prior art, and in FIG. 2, which is an equivalent circuit diagram of the device of FIG. 1, stacked capacitor-type memory cells are provided at intersections between the word lines $WL_0$, $WL_1$, $WL_2$, and $WL_4$ and bit lines $BL_0$ and $BL_1$. A capacitor of each memory cell is comprised of an electrode $E_0$, a counter electrode $E_1$, and an insulating layer 6 (see FIG. 3) between the electrodes $E_0$ and $E_1$. Provided are the following conductive layers:

a first polycrystalline silicon layer for the word lines $WL_0$, $WL_1$, $WL_2$, and $WL_4$;

a second polycrystalline silicon layer for the electrode $E_0$;

a third polycrystalline silicon layer for the counter electrode $E_1$; and an aluminum layer for the bit lines $BL_0$ and $BL_1$.

Figure 3:
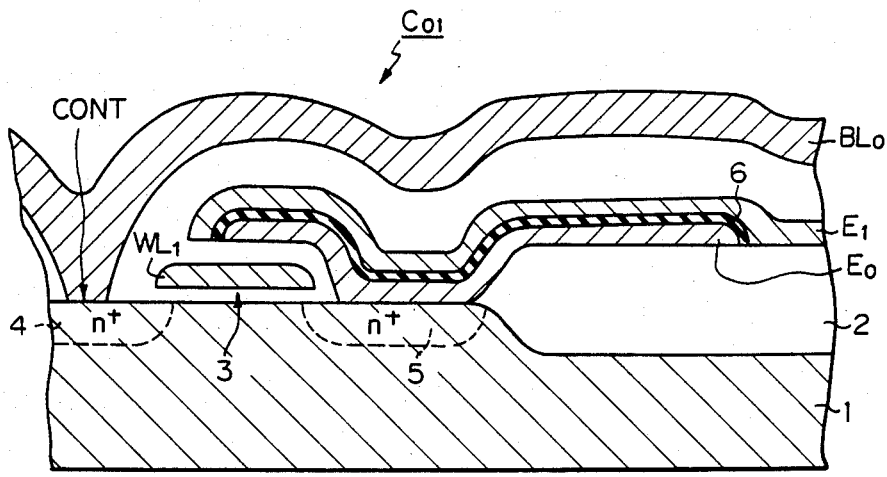
FIG. 3 is a cross-sectional view of the device of FIG. 1 taken along the line III—III in FIG. 1.

Note that "CONT" designates a contact hole for connecting the bit line $BL_0$ or $BL_1$ to an impurity diffusion (doped) region 4 on a semiconductor substrate 1 (see FIG. 3). In addition, the partly shaded areas designate field areas, and the inner areas thereof designate active areas.

One stacked capacitor-type memory cell, such as $C_{01}$, will be explained with reference to FIG. 3. In FIG. 3, a thick field oxide ($SiO_2$) layer 2 is formed on a $p^-$-type semiconductor substrate 1. Then a gate oxide ($SiO_2$) layer 3 is formed. Disposed on the layer 3 is a word line $WL_1$ serving as a gate of a transfer transistor which is made of the first polycrystalline silicon layer. After that, $N^+$-type impurity diffusion regions 4 and 5 serving as a source and a drain, respectively, of the transfer transistor are formed by self-alignment.

An electrode $E_0$ made of the second polycrystalline silicon layer is formed on the word line $WL_1$ and the field oxide layer 2. In this case, the electrode $E_0$ is connected electrically to the impurity diffusion region 5. An insulating layer 6 as a capacitor dielectric, which is made of, for example, chemical vapor deposition (CVD) silicon nitride ($Si_3N_4$), is formed on the electrode $E_0$. Further, the counter electrode $E_1$ made of the third polycrystalline silicon layer is formed on the insulating layer 6.

Note that the insulating layer 6 has a large dielectric constant and a small leak current characteristic. The blank portions of FIG. 3 designate other insulating layers made of $SiO_2$, phosphosilicate glass (PSG), or the like.

In FIG. 3, since a capacitor formed by the electrode $E_0$, the insulating layer 6, and the counter electrode $E_1$ extends over the field oxide layer 2 and the word line $WL_1$, the capacitance thereof is larger than that of the conventional one-transistor one-capacitor type of memory cell in which a capacitor is formed on the impurity diffusion region 5. This characteristic is beneficial in obtaining a high integration and a large capacitance.

Figure 5:
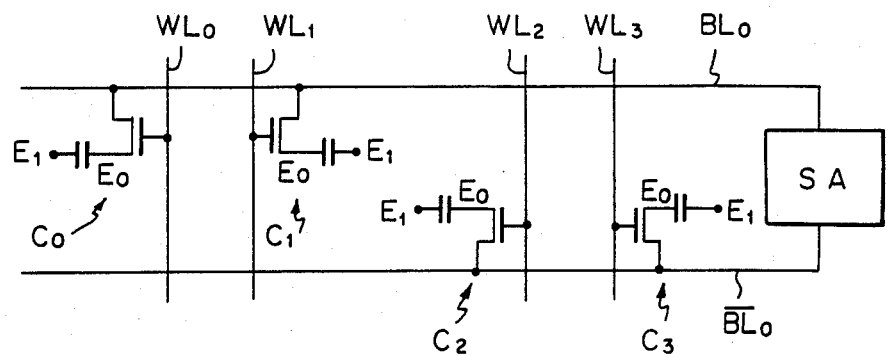
FIG. 5 is an equivalent circuit diagram of the device of FIG. 4.

However, the stacked capacitor-type memory cells as illustrated in FIGS. 1 and 3 are applied to a device having an open bit line layout as illustrated in the equivalent circuit diagram of FIG. 2 but are not applied to a device having a folded bit line layout as illustrated in the equivalent circuit diagram of FIG. 5.

Note that the folded bit line layout, as compared with the open bit line layout, are disadvantageous in regard to integration density but are advantageous in regard to noise immunity since the noises generated in a pair of bit lines are compensated for by each other at a sense amplifier which senses and amplifies the potential difference between the bit line pair.

Figure 4:
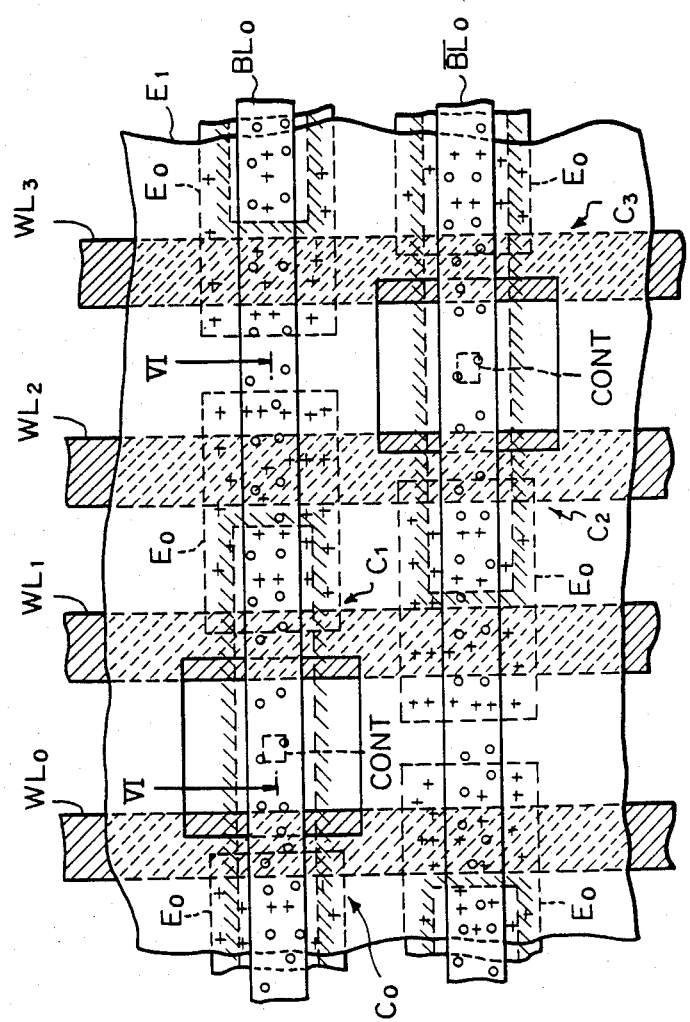
FIG. 4 is a plan view of an embodiment of the semiconductor memory device incorporating stacked capacitor-type memory cells according to the present invention.

In FIG. 4, which illustrates an embodiment of the present invention, and in FIG. 5, which is an equivalent circuit diagram of the device of FIG. 4, stacked capacitor-type memory cells $C_0$ and $C_1$ are provided at intersections between the word lines $WL_0$ and $WL_1$ and the bit line $BL_0$, but no memory cells are provided at intersections between the word lines $WL_2$ and $WL_3$ and the bit line $BL_0$. On the other hand, stacked capacitor-type memory cells $C_2$ and $C_3$ are provided at intersections between the word lines $WL_2$ and $WL_3$ and the bit line $\overline{BL_0}$, but no memory cells are connected at intersections between the word lines $WL_0$ and $WL_1$ and the bit line $\overline{BL_0}$. That is, two memory cells are provided at every other intersection with the word line along one bit line. This is because a memory cell is connected at only one of the two intersections between each word line and each bit line pair, resulting in vacancy (i.e., nonconnection) at half of all the intersections, which tends to decrease the integration density of the device.

However, according to the present invention, the electrode $E_0$ of the capacitor of each memory cell is formed on its own word line (gate) and an adjacent word line to occupy the adjacent vacant intersection. In addition, the counter electrode $E_1$ of the capacitors of the memory cells is formed on the entire surface of the device except for contact areas including the contact holes CONT.

Figure 6:
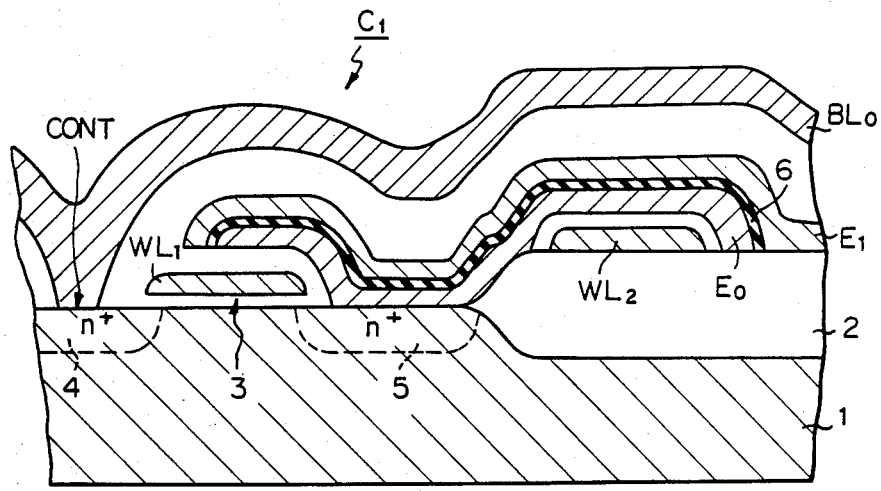
FIG. 6 is a cross-sectional view of the device of FIG. 4 taken along the line VI—VI in FIG. 4.

FIG. 6 is a cross-sectional view of the device of FIG. 4 taken along the line VI—VI in FIG. 4. In FIG. 6, the elements which are the same as those of FIG. 3 are denoted by the same reference numerals. As is illustrated in FIG. 6, the electrode $E_0$ made of the second polycrystalline silicon layer is provided over its own word line $WL_1$ (the first polycrystalline silicon layer) and the adjacent word line $WL_2$ (the first polycrystalline silicon layer). Thus, the capacitance of a capacitor formed by the electrode $E_0$, the counter electrode $E_1$, and the insulating layer 6 is increased, this being also beneficial in obtaining a high integration density and a large capacitance.

Figure 7:
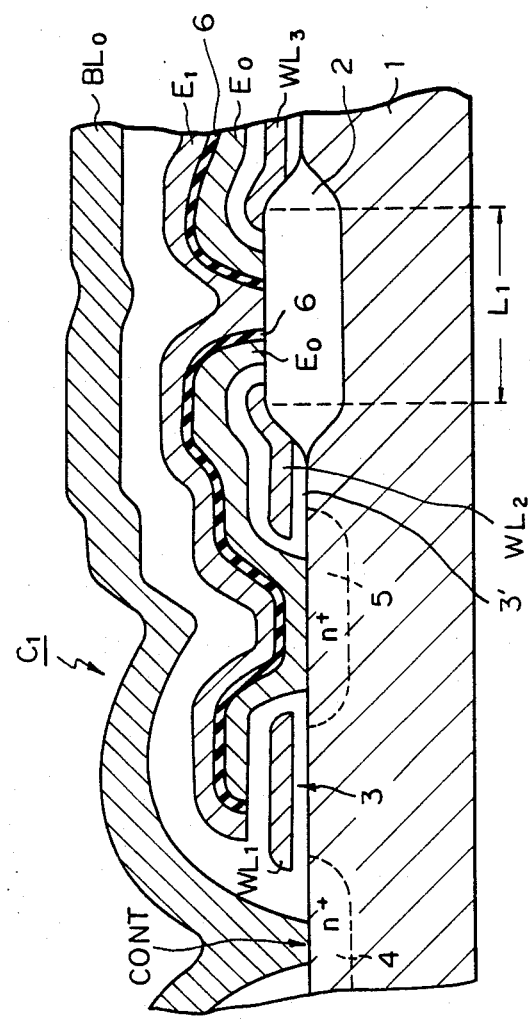
FIGS. 7 and 8 are modifications of the embodiment of FIG. 6.

FIG. 7 is a modification of FIG. 6. The difference between FIG. 7 and FIG. 6 is that in FIG. 7 the word line $WL_2$ is disposed partly on the thick field oxide layer 2 and partly on the thin oxide layer 3', which is the same as the gate oxide layer 3. As a result, the width $L_1$ of the field oxide layer 2 can be almost a minimum line width determined by the manufacturing technology. In FIG. 7, since no field oxide layer 2 is present between the word lines $WL_1$ and $WL_2$, the connection area between the second polycrystalline silicon layer $E_0$ and the impurity diffusion region 5 is determined by the space between the word lines $WL_1$ and $WL_2$ only. Therefore, this space can be a minimum value. On the other hand, in FIG. 6, the above-mentioned connection area is determined by the word line $WL_1$ and the field oxide layer 2. Therefore, since this connection area is reduced due to the displacement of the alignment of the word line $WL_1$ and the field oxide layer 2, it is necessary to design the distance therebetween at a sufficient value. In addition, it is necessary to design the distance between the impurity diffusion region 5 and the word line $WL_2$ at a sufficient value in view of the displacement of the alignment therebetween. Thus, the space between the word lines $WL_1$ and $WL_2$ in FIG. 7 can be reduced as compared with that in FIG. 6.

Figure 8:
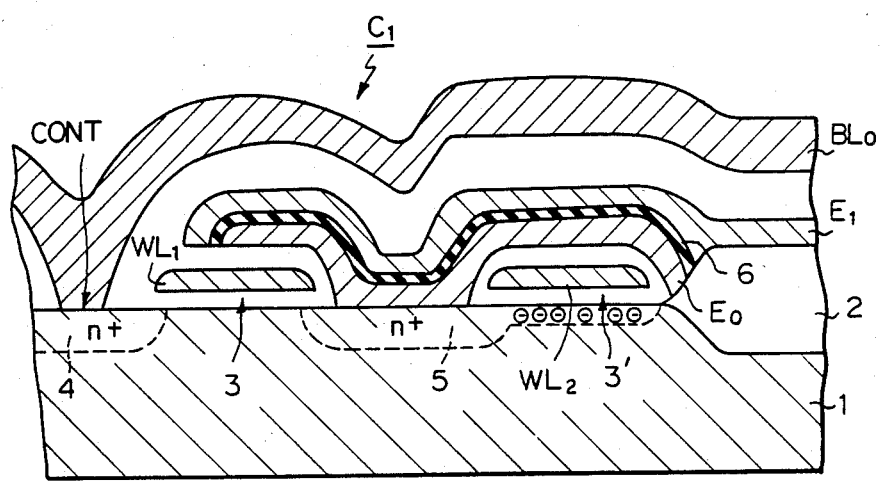

FIG. 8 is also a modification of FIG. 6. The difference between FIG. 8 and FIG. 6 is that in FIG. 8 the insulating layer 3' immediately beneath the adjacent word line $WL_2$ is made thin. In this case, the insulating layer 3' is also the same as the gate oxide layer 3 immediately beneath the word line $WL_1$. For instance, it can be of silicon nitride. Further, N-type impurities are implanted in advance on the surface of the substrate 1 beneath the word line $WL_2$ by ion implantation or the like. Therefore, the MOS structure formed by the word line $WL_2$, the insulating layer 3', and the N-type impurity doped region of the substrate 1 serving as a charge-storing portion form a capacitor having a relatively large capacitance and which serves as a capacitor of the stacked capacitor-type memory cell (and has normally-on characteristics). As a result, the capacitance of the capacitor of the memory cell of FIG. 7 is increased as compared with that of FIG. 6.

Note that a $P^-$-type semiconductor substrate is used in the above-mentioned embodiments. However, obviously, a $N^-$-type substrate can be used.

As was explained hereinbefore, according to the present invention, the capacitor is formed on an adjacent word line so as to increase the capacitor capacitance, thereby obtaining a semiconductor memory device of a high integration density and a large capacitance having a folded bit line layout.

We claim:

1. A semiconductor memory device comprising:
   a semiconductor substrate of a first conductivity type;
   a plurality of word lines extending in parallel over said substrate;
   a plurality of sense amplifiers;
   a plurality of pairs of bit lines extending over said substrate transversely to said word lines, each said pair of bit lines being connected to corresponding inputs of a corresponding one of said sense amplifiers, and both of the bit lines of each said pair intersecting each of said word lines; and
   stacked capacitor-type memory cells, each formed in the vicinity of an intersection between a corresponding one of said word lines and a corresponding one of said pairs of said bit lines,
   wherein each of said memory cells comprises:
      first and second impurity doped regions of a second conductivity type opposite to said first conductivity type formed in said substrate, each said first impurity doped region being electrically connected to a respective one of said bit lines, said first and second impurity doped regions and a respective portion of said corresponding one of said word lines forming a transfer transistor;
      a first conductive layer electrically connected to said second impurity doped region, for forming a first of two capacitor electrodes, said first conductive layer extending over a respective part of another one of said word lines adjacent to said corresponding word line;
      an insulating layer disposed on said first conductive layer; and
      a second conductive layer, disposed on said insulating layer, for forming the second of said two capacitor electrodes.

2. A device as set forth in claim 1, wherein said first conductive layer of each said memory cell extends over a part of said corresponding word line of the memory cell.

3. A device as set forth in claim 1, further comprising a field insulating layer formed between said respective part of said another adjacent word line of each said memory cell and said substrate.

4. A device as set forth in claim 1 or 3, comprising a further insulating layer formed between said respective part of said another adjacent word line of each said memory cell and said substrate.

5. A device as set forth in claim 4, further comprising a third impurity doped region of said second conductivity type within said substrate beneath said respective part of said another adjacent word line and said further insulating layer of each said memory cell, so that a MIS structure formed by said respective part of said another adjacent word line, said further insulating layer, and said substrate has normally-on characteristics.

6. A device as set forth in claim 1, wherein said further insulating layer is made of silicon nitride.

7. The device of claim 4, further comprising a third impurity doped region of said second conductivity type within said substrate beneath said respective part of said another adjacent word line and said further insulating layer of each said memory cell, so that a MIS structure formed by said part of said another adjacent word line, said further insulating layer, and said substrate contribute to the capacitance of the memory cell.

8. The device of claim 1, 2, 3 or 6, wherein said device is of the folded-bit-line type.

9. The device of claim 8, wherein alternating ones of said word lines are effective for selecting a respective one of said memory cells of only a respective one of said bit lines of each said bit line pair.

10. The device of claim 8, wherein said first capacitor electrode is provided individually for each said memory cell, and said second capacitor electrode extends in common over all of said memory cells.

* * * * *